United States Patent
Katagiri et al.

(10) Patent No.: US 8,362,614 B2
(45) Date of Patent: Jan. 29, 2013

(54) FINE PITCH GRID ARRAY TYPE SEMICONDUCTOR DEVICE

(75) Inventors: Mitsuaki Katagiri, Chuo-ku (JP);
Hiroya Shimizu, Chiyoda-ku (JP);
Fumiyuki Osanai, Chuo-ku (JP);
Yasushi Takahashi, Chuo-ku (JP); Seiji Narui, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 1321 days.

(21) Appl. No.: 11/247,215

(22) Filed: Oct. 12, 2005

(65) Prior Publication Data
US 2006/0081972 A1 Apr. 20, 2006

(30) Foreign Application Priority Data
Oct. 13, 2004 (JP) ................................. 2004-298611

(51) Int. Cl.
*H01L 23/48* (2006.01)
*H01L 23/52* (2006.01)
*H01L 29/40* (2006.01)

(52) U.S. Cl. ........ 257/738; 257/666; 257/691; 257/673; 257/737; 257/786; 257/E23.079

(58) Field of Classification Search .................. 257/738, 257/E23.079
See application file for complete search history.

(56) References Cited

U.S. PATENT DOCUMENTS

| | | | | | |
|---|---|---|---|---|---|
| 5,714,801 | A | * | 2/1998 | Yano et al. | 257/691 |
| 5,838,627 | A | * | 11/1998 | Tomishima et al. | 365/230.03 |
| 2004/0041166 | A1 | * | 3/2004 | Morrison | 257/117 |
| 2004/0082102 | A1 | * | 4/2004 | Sasaki | 438/106 |

FOREIGN PATENT DOCUMENTS

JP 2001-185576 A 7/2001

* cited by examiner

*Primary Examiner* — Lynne Gurley
*Assistant Examiner* — Hsin-Yi Hsieh
(74) *Attorney, Agent, or Firm* — Sughrue Mion, PLLC

(57) ABSTRACT

A semiconductor device has a semiconductor chip in which a plurality of semiconductor components and a plurality of pads are arranged, a plurality of external connection contacts arranged in grids, and a plurality of wires for electrically connecting the pads and the external connection contacts. The pads include a plurality of pad groups including a pair of electrode pads connected to the plurality of semiconductor components in common and a plurality of signal pads respectively connected to the semiconductor components connected to the electrode pads. In each pad group, each signal pad is arranged adjacently to one of the electrode pads; and each wire extending from each signal pad is extended along a wire extended from the electrode pad adjacent to each signal pad.

11 Claims, 8 Drawing Sheets

FINE PITCH GRID ARRAY TYPE SEMICONDUCTOR DEVICE

BACKGROUND OF THE INVENTION

1. Field of the Invention

The present invention relates to a semiconductor device, and more particularly to a semiconductor device preferably applied to a FBGA (Fine pitch Ball Grid Array) type DRAM (Dynamic Random Access Memory).

2. Description of the Related Art

There is known a conventional semiconductor device disclosed in Japanese Patent Laid-Open No. 2001-185576 (Patent Document 1). The semiconductor device disclosed in Patent Document 1 is provided with pads for signal lines (signal pads), pads for a power supply potential (power supply pads), and pads for a ground potential (ground pads). In this semiconductor device, in order to reduce a power supply based inductance in the semiconductor device, all of the pads are formed on a surface of a wiring board, the surface connected with a semiconductor pellet (semiconductor chip) by wire bonding, and are connected with a signal contact, a power supply potential contact, and a ground potential contact formed on another surface of the wiring board electrically independently one another by through hole conductors. The power supply pads and the ground pads are respectively arranged at the both sides of the signal pads.

However, although Patent Document 1 discloses an effective technique for reducing the power supply based inductance in the semiconductor device, Patent Document 1 does not disclose a reduction in size (size shrink) of a semiconductor chip used in the semiconductor device.

In the semiconductor device such as a DRAM, a reduction in size of a semiconductor chip is desired. By the reduction in size of the semiconductor chip, a number of semiconductor chips obtained from a piece of silicon wafer can be increased, and final costs of the semiconductor device can be reduced.

For that reason, semiconductor manufactures try to reduce sizes of components such as a transistor and a capacitor in the semiconductor device and to reduce sizes of wires in the chip by improvement of the production process. With these efforts, chips in DRAMs having the same capacity have been remarkably made small.

With techniques similar to the wiring in the chip and the production process for the semiconductor chip, pads for transmitting and receiving signals between a semiconductor chip and a package, a board, or a memory module and for supplying a power supply potential and a ground potential to the chip can be made small principally in the same way.

However, these pads are required to be capable of transmitting and receiving signals to/from the outside of the chip, such as a package. Therefore, pads are required to have sizes so as to be used in a step called "post-process", for example, packaging. In a FBGA using a wiring board, it is necessary to connect pads and wires inside the package reliably by wire bonding. Also, in a FBGA using a tape substrate, it is necessary to connect pads and wires inside the package reliably by a flexible tape substrate. The connection technique in the post-process has not advanced rapidly as compared with the processing technique inside the chip. Therefore, even if the size inside the chip is significantly reduced, there is a possibility in that connection is performed by only current pad sizes and current pad pitches under constraints on the connection means for the semiconductor chip and the package. Pads for semiconductor chips in the current semiconductor producing technique are formed in a square or a rectangle having a side of approximate 80 to 100 μm, and pad pitches are larger than the side.

As described in Patent Document 1, it is preferable that the power supply pads and the ground pads are arranged at both sides of the signal pads on the main surface of the semiconductor chip in view of electrical characteristics. However, this causes an increase of pads to provide a problem of preventing a reduction in size of the semiconductor chip. On the other hand, when attentions are paid to only size reduction of the semiconductor chip and then the number of power supply pads and ground pads is reduced excessively, it is impossible to make electrical characteristics, namely, inductance of power supply and ground wires small sufficiently, and, as a consequence, there is a problem in that the semiconductor device cannot be operated at high speed.

This situation causes a problem in that a further reduction in size of chip cannot be attained under constraints on pads to be arranged on the main surface of the chip regardless of the situation in that a reduction in size of the semiconductor chip can be attained by improvement of the production process for the semiconductor chip.

SUMMARY OF THE INVENTION

The inventors have achieved a technique to solve the above-mentioned problems as the result of researches of techniques for achieving a reduction in size of chips while attaining sufficient electrical characteristics, namely, attaining lowered inductance in power supply and ground wires so as to reduce noise.

Accordingly, it is an object of the present invention to provide a semiconductor device capable of reducing a size of a semiconductor chip to reduce costs while maintaining low power supply based inductance to ensure high-speed operation of the semiconductor device.

According to the first aspect of the present invention, a semiconductor device is provided with a semiconductor chip in which a plurality of semiconductor components are formed and a plurality of pads are arranged on a center part of a main surface of the semiconductor chip; a plurality of external connection contacts arranged in grids; and a plurality of wires for electrically connecting each of the pads and each of the external connection contacts. The pads include a plurality of pad groups including at least one pair of electrode pads connected to the plurality of semiconductor components in common and a plurality of signal pads respectively connected to the semiconductor components connected to the electrode pads and for transmitting and receiving signals to/from the semiconductor components. The pair of electrode pads includes a power supply pad for supplying a power supply voltage to the semiconductor components and a ground pad for supplying a ground voltage to the semiconductor components. In each of the pad groups, each of the signal pads is arranged adjacently to the power supply pad or the ground pad. Each of the wires extending from each of the signal pads is extended along a wire extending from the power supply pad or the ground pad which is adjacent to the pad in a same pad group.

According to the second aspect of the present invention, a semiconductor device is provided with a semiconductor chip in which a DRAM component is arranged on a main surface and a plurality of pads are arranged in lines in parallel with any side defining a contour of the main surface; and a fine pitch grid array type substrate on which the semiconductor chip is mounted. The electrode pads include at least a first electrode pad for supplying a power supply voltage to the semiconductor chip and a second electrode pad for supplying a ground voltage to the semiconductor chip. The substrate includes an external connection contact and connection means for connecting the external connection contact and the semiconductor chip. Also, when a length of an area where the electrode pads are capable of being arranged in an arrangement direction of the electrode pads on the main surface of the semiconductor chip is represented by A, a minimum arrangement pitch of the electrode pads is represented by p, and a total number of the first electrode pad and the second electrode pad is represented by N1, N1/(A/p) is more than 0.4.

According to the third aspect of the present invention, a semiconductor device is provided with a semiconductor chip in which a DRAM component is arranged on a main surface and a plurality of pads are arranged in lines in parallel with any side defining a contour of the main surface; and a fine pitch grid array type substrate on which the semiconductor chip is mounted. The electrode pads include at least a first electrode pad for supplying a power supply voltage to the semiconductor chip, a second electrode pad for supplying a ground voltage to the semiconductor chip, an input/output pad, and an input signal pad. The substrate includes an external connection contact and connection means for connecting the external connection contact and the semiconductor chip. Also, when a length of an area where the electrode pads are capable of being arranged in an arrangement direction of the electrode pads on the main surface of the semiconductor chip is represented by A, a minimum arrangement pitch of the electrode pads is represented by p, and a total number of specific electrode pads in the first electrode pads and specific electrode pads in the second electrode pads is represented by N3, N3/(A/p) is more than 0.3. Here, the specific electrode pads in the first electrode pads are electrode pads connected to a power supply of an input/output buffer in the DRAM component and electrode pads connected to a power supply of a protection diode connected to an input buffer in the DRAM component. The specific electrode pads in the second electrode pads are electrode pads connected to a ground of the input/output buffer in the DRAM component and electrode pads connected to a ground of another protection diode different from the protection diode connected to the input buffer in the DRAM component.

According to the fourth aspect of the present invention, a semiconductor device is provided with a semiconductor chip in which a DRAM component is arranged on a main surface and a plurality of pads are arranged in lines in parallel with any side defining a contour of the main surface; and a fine pitch grid array type substrate on which the semiconductor chip is mounted. The electrode pads include at least a first electrode pad for supplying a power supply voltage to the semiconductor chip, a second electrode pad for supplying a ground voltage to the semiconductor chip, an input/output pad, and an input signal pad. The substrate includes an external connection contact and connection means for connecting the external connection contact and the semiconductor chip. Also, when a length of an area where the electrode pads are capable of being arranged in an arrangement direction of the electrode pads on the main surface of the semiconductor chip is represented by A1, a minimum arrangement pitch of the electrode pads is represented by p, and a total number of pads connected to a power supply of an input/output buffer in the DRAM component in the first electrode pads and of pads connected to a ground of the input/output buffer in the DRAM component in the second electrode pads is represented by N2, N2/(A1/p) is more than 0.12.

According to the fifth aspect of the present invention, a semiconductor device is provided with a semiconductor chip in which a DRAM component is arranged on a main surface and a plurality of pads are arranged in lines in parallel with any side defining a contour of the main surface; and a fine pitch grid array type substrate on which the semiconductor chip is mounted. The electrode pads include at least a first electrode pad for supplying a power supply voltage to the semiconductor chip, a second electrode pad for supplying a ground voltage to the semiconductor chip, an input/output pad and an input signal pad. The substrate includes an external connection contact and connection means for connecting the external connection contact and the semiconductor chip. At least one first electrode pad and at least one second electrode pad are arranged in an area where the input signal pad is arranged.

With the semiconductor device of the present invention, while maintaining low power supply based inductance and ensuring high-speed operation of the semiconductor device, a reduction in size of the semiconductor chip can be attained and costs can be suppressed.

The above and other object, features, and advantages of the present invention will become apparent from the following description based on the accompanying drawings which illustrate preferred embodiments of the present invention.

DESCRIPTION OF THE PREFERRED EMBODIMENTS

First, explanations will be given of a semiconductor device of a first embodiment according to the present invention with reference to FIG. 1 to FIG. 4 and FIG. 7. The semiconductor device according to the first embodiment is used as a DRAM (Dynamic Random Access Memory) of DDR2 (Double Data Rate 2) standard and is packaged in a FBGA (Fine pitch Ball Grid array) type.

Figure 1:
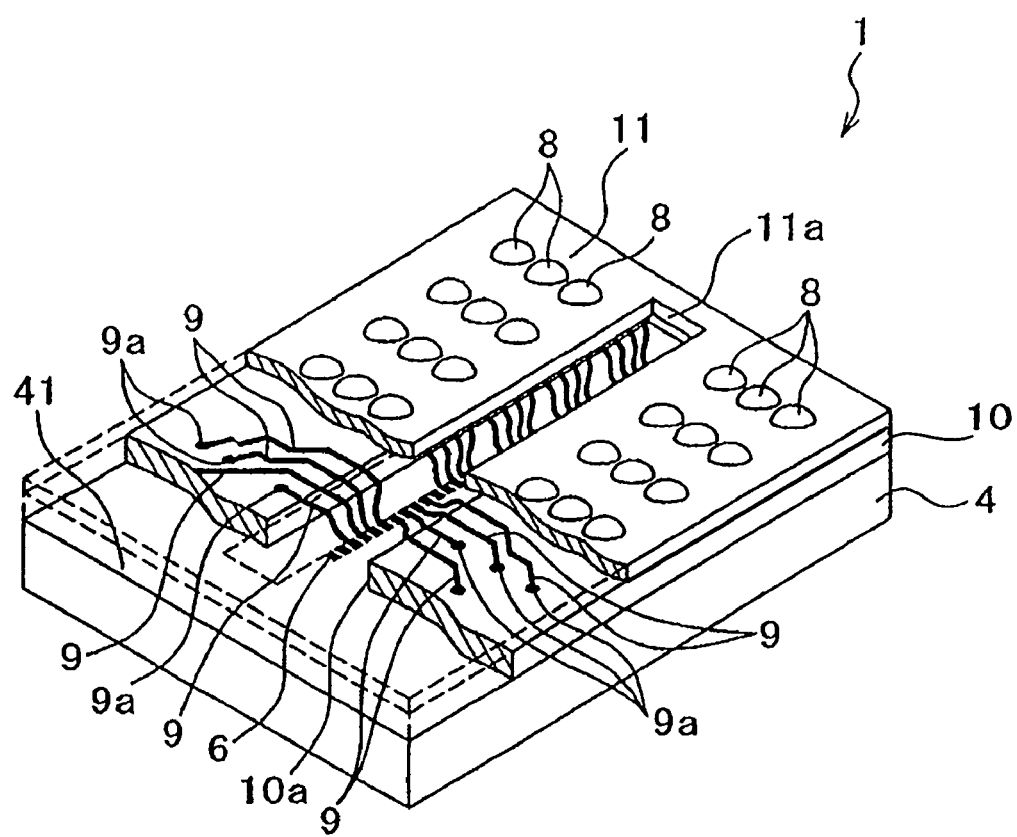
FIG. 1 is a partial sectional and perspective view of a semiconductor device of a first embodiment according to the present invention.

Referring to FIG. 1, semiconductor device 1 of the first embodiment according to the present invention is shown that includes semiconductor chip 4 and tape substrate 11 joined to semiconductor chip 4 via adhesive layer 10. Semiconductor chip 4 has a plurality of buffers 4a (refer to FIG. 2) to be DRAM components and a plurality of pads 6 arranged in the center on main surface 41 of semiconductor chip 4. Main surface 41 of semiconductor chip 4 is oriented to tape substrate 11. Tape substrate 11 is provided with a plurality of solder balls 8 to be external connection contacts. Solder balls 8 are arranged in grids. Pad 6 and solder ball 8 are electrically connected via wire 9.

Semiconductor device 1 is one example of a FBGA type DRAM, and pad 6 and solder ball 8 in semiconductor chip 4 are connected via wire 9 without a wiring board using wires and epoxy resin impregnated with glass. Tape substrate 11 is adhered to main surface 41 of semiconductor chip 4 via adhesive layer 10. Band-shaped openings 10a, 11a are respectively formed in the centers of adhesive layer 10 and tape substrate 11. Opening 10a of adhesive layer 10 is formed to have the same center and the same length as opening 11a of tape substrate 11 and to be slightly wider than opening 11a of tape substrate 11. The length of semiconductor chip 4 in an arrangement direction of pads 6 is shorter than 11 mm.

Pads 6 are positioned in the center of openings 10a, 11a and are arranged in a straight line. Also, openings 10a, 11a positioned in the center of semiconductor device 1 may be sealed by resin and the like in order to protect pads 6 and wires 9 arranged on main surface 41 of semiconductor chip 4.

Wire 9 has connection part 9a to solder ball 8. Connection part 9a is a part of wire 9. Solder ball 8 is arranged so as to penetrate tape substrate 11 in the thickness direction thereof. Connection part 9a is connected with solder ball 8 in a rear surface (surface toward semiconductor chip 4) of tape substrate 11. Wire 9 is made from copper, gold, or the like. Wire 9 may be made by electrolytic plating. When wire 9 is made by electrolytic plating, based on the need of feeding for plating, feeding wire for connecting with the outside may be extended from connection part 9.

Next, explanations will be given of input/output buffers 4a1 which are parts of various semiconductor components arranged in semiconductor chip 4 of semiconductor device 1 with reference to FIG. 2.

Pads 6 in semiconductor chip 4 are roughly divided into signal pads 6a and electrode pads 6b. Signal pad 6a includes two input/output pads 6a1 for inputting and outputting data to/from two input/output buffers 4a1. Electrode pads 6b are divided into power supply pads 6bV for supplying a power supply voltage to the semiconductor components and ground pads 6bG for supplying a ground voltage to the semiconductor components.

Power supply pad 6bV is connected with a power supply for one transistor 4a11 in two transistors 4a11, 4a12 to be input/output buffer 4a1. Ground pad 6bG is connected with a ground for another transistor 4a12 in input/output buffer 4a1. Accordingly, in one input/output buffer 4a1, a feedback current flows through corresponding power supply pad 6bV or ground pad 6bG inversely to a signal line by a signal which flows in signal pad 6a1 connected to input/output buffer 4a1. In order to improve electrical characteristics of input/output buffer 4a1 (in other words, to reduce noise in operation of input/output buffer 4a1), power supply pad 6bV and ground pad 6bG connected with the power supply and the ground in input/output buffer 4a1 are preferably arranged adjacently to signal pad 6a.

However, when, from all of buffers 4a, signal pad 6a, power supply pad 6bV and ground pad 6bG are drawn to main surface 41 of chip so as to be arranged, pads are triple required as many as signal pads 6a in buffer 4a. This is an obstacle to a reduction in size of semiconductor chip 4.

Figure 2:
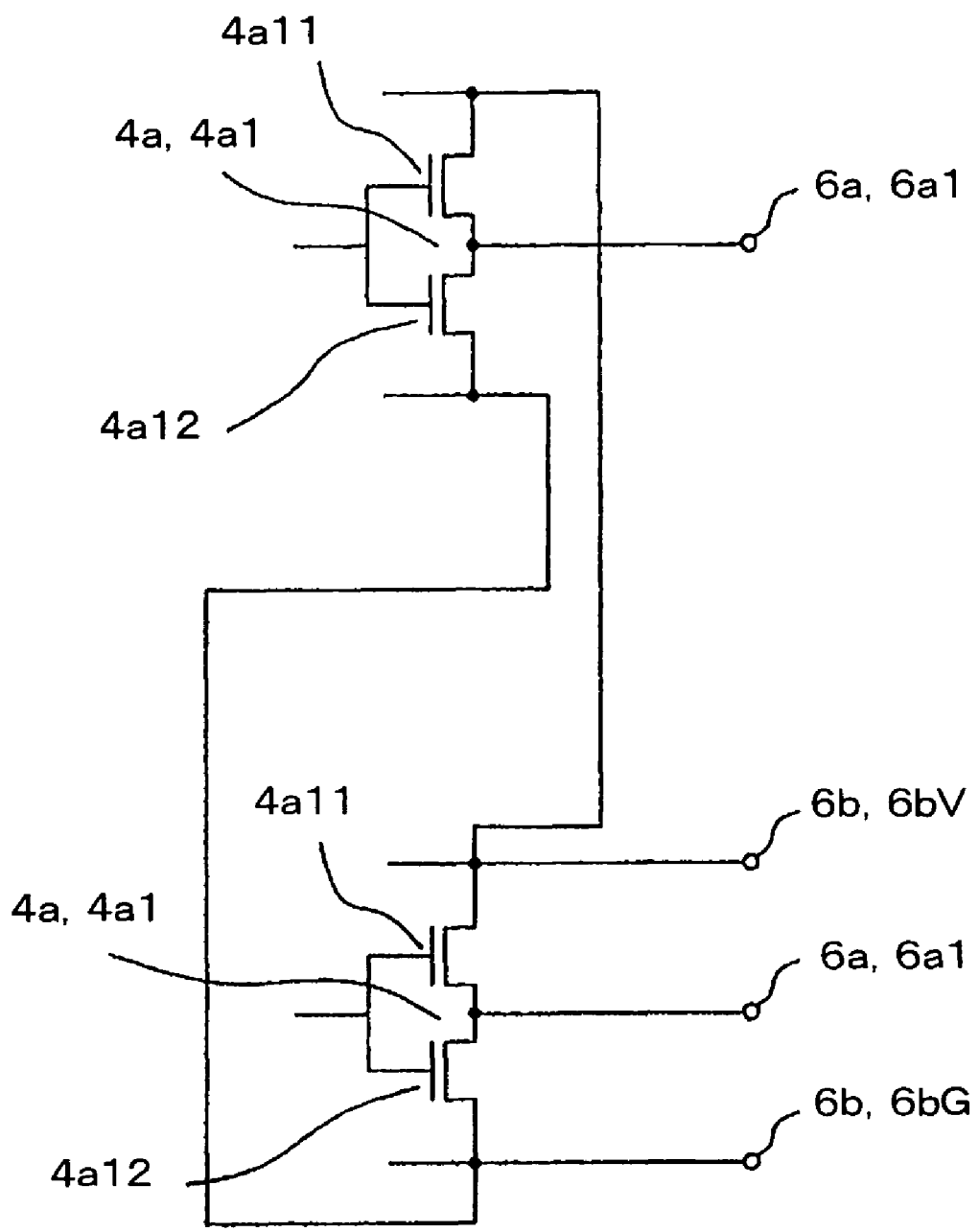
FIG. 2 is a circuit diagram of an input/output buffer arranged in a semiconductor chip shown in FIG. 1.

So, in the first embodiment, each power supply pad 6bV and each ground pad 6bG are not dawn from each input/output buffer 4a1, but, as shown in FIG. 2, a power supply and a ground are used in common for a plurality of input/output buffers 4a1 and power supply pad 6bV and ground pad 6bG are drawn to main surface 41 of chip. Concretely, power supply pad 6bV is connected to a power supply of one transistor 4a11 in one input/output buffer 4a1 and a power supply of one transistor 4a11 in another input/output buffer 4a1 in common. Ground pad 6bG is connected to a ground of another transistor 4a12 in one input/output buffer 4a1 and a ground of another transistor 4a12 in another input/output buffer 4a1 in common. With this arrangement, it is possible to obtain a suitable number of pads for a reduction in size of semiconductor chip 4 without increasing a number of pads for input/output buffer 4a.

Figure 3:
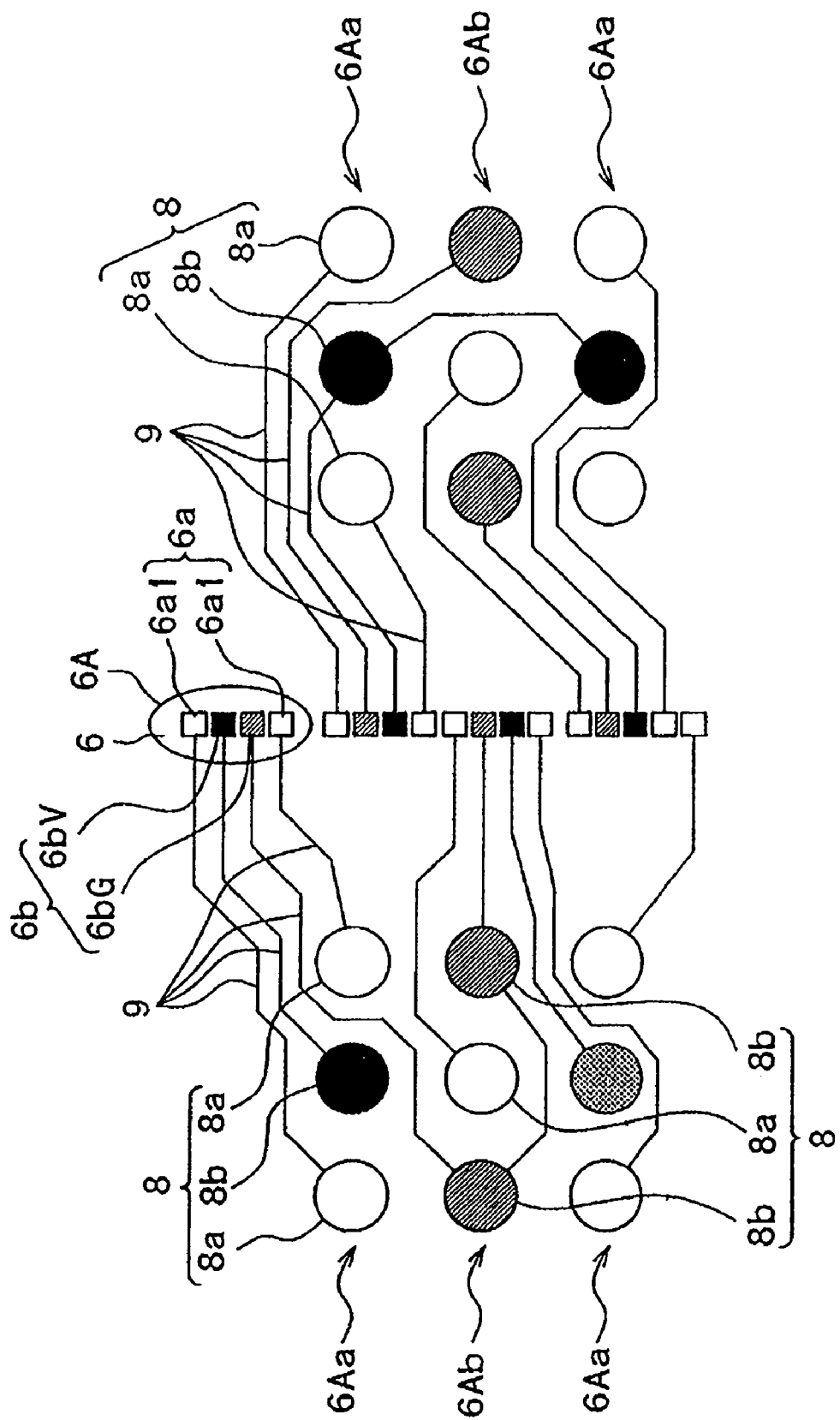
FIG. 3 is a schematic view for explaining an arrangement relationship among pads, solder balls, and wires in the semiconductor device shown in FIG. 1.

Next, explanations will be given of pads 6, solder balls 8, and wires 9 with reference to FIG. 3. Referring to FIG. 3, an arrangement relationship among pads 6, solder balls 8, and wires 9 in semiconductor device 1 according to the first embodiment is shown.

Pads 6 include a plurality of pad groups 6A. FIG. 3 shows four pad groups 6A. Each pad group 6A has a pair of electrode pads 6b (power supply pad 6bV and ground pad 6bG) used for a plurality of input/output buffers 4a in common and a plurality of signal pads 6a1 for transmitting and receiving signals to/from input/output buffers 4a.

Each signal pad 6a1 in each pad group 6A is arranged adjacently to power supply pad 6bV or ground pad 6bG in that pad group 6A. Each wire 9 extending from each signal pad 6a1 in each pad group 6A extends along wire 9 extending from adjacent power supply pad 6bV or ground pad 6bG. With this arrangement, while maintaining low power supply inductance, a number of pads and a number of wires can be reduced, a reduction in size of semiconductor chip 4 can be attained, and therefore costs can be suppressed.

Each wire 9 is extended in the same direction in each pad group 6A. With this arrangement, power supply based inductance can be made low with reliability.

Pads 6 are arranged in a line parallel to a side which defines a contour of main surface 41 of semiconductor chip 4. Solder balls 8 are arranged in grids at both sides of the line of pads 6. Wires 9 alternately extend to both sides every pad group 6A. With this arrangement of pads 6, solder balls 8, and wires 9, it is possible to obtain low power supply based inductance with reliability and to make the arrangement of pads 6, solder balls 8, and wires 9 most compact, and therefore a significant reduction in size of semiconductor chip 4 can be attained.

Concretely, each pad group 6A has a pair of electrode pads 6b (power supply pad 6bV and ground pad 6bG) used for two input/output buffers 4a1 in common and two signal pads 6a1 for transmitting and receiving signals to/from two input/output buffers 4a1. Solder balls 8 are arranged in grids in three lines orthogonal to the arrangement direction of pads 6 at both sides of the line of pads 6. In three lines of solder balls 8, row 6Aa in which solder ball 8b connected to the external power supply is positioned in the center and solder balls 8a for transmitting and receiving signals are positioned at both sides and row 6Ab in which solder ball 8a for transmitting and receiving signals is positioned in the center and solder balls 8b connected to the external power supply are positioned at both sides are alternately arranged. In each pad group 6A, power supply pad 6bV and ground pad 6bG are arranged between two signal pads 6a1, 6a1, and wires 9 extending from power supply pad 6bV and ground pad 6bG are extended between wires 9 extending from two signal pads 6a1, 6a1.

FIG. 3 shows a DDR2 data pin standard, namely, an example of a suitable arrangement of pads and an example of routing wires 9 when, based on the arrangement of solder balls 8 connected to input/output buffer 4a, two input/output buffers 4a are collected in chip as shown in FIG. 2. With this pad arrangement, wires 9 drawn from two signal pads 6a connected with two collected input/output buffers 4a to solder balls 8a and wires 9 respectively drawn from power supply pad 6bV connected with the power supply of input/output buffers 4a and from ground pad 6bG connected with the ground to solder balls 8b are drawn to the same side relatively to the pad column arranged vertically. In this way, since wires 9 for signals, wires 9 for the power supply, wires 9 for the ground in paired buffers 4a are arranged at the same side, the mutual inductance among wires 9 increases and the effective inductance of the power supply and the ground decreases. Induced voltage caused by a transient current which flows in operation of semiconductor device 1 is represented by $L_{eff} \times dI/dt$. If the effective inductance can be reduced, the induced voltage, namely, noise can be reduced, and therefore higher-speed operation can be performed. Here, $L_{eff}$ represents effective inductance and dI/dt represents a rate of change of a current value with respect to time.

Incidentally, sizes of pads 6 are actually very small in comparison with solder balls 8, however, pads 6 are enlarged in FIG. 3 so as to be viewed easily.

Next, explanations will be given of a number of pads in semiconductor chip 4 with reference to FIG. 4.

Pads 6 are roughly divided into signal pads 6a for transmitting and receiving signals between a memory cell and an external component, an external semiconductor device, or electronic equipment, power supply pad 6b for supplying a power supply potential to semiconductor device to itself, and ground pads 6b for supplying a ground potential to semiconductor device 1 to itself. Signal pads 6a are divided in details into pads 6a1 for inputting and outputting data and pads for inputting address information for controlling semiconductor device 1 from the outside and for storing and reading data in/from semiconductor device 1. Since signal pads 6a are defined in accordance with specifications of semiconductor device 1, namely, a capacity or a type of memory, a number of signal pads 6 cannot be determined freely.

As to power supply pad 6bV and ground pad 6bG, a plurality of same pads are prepared in order to ensure electrical characteristics of semiconductor device 1, however, a pad is used for a plurality of DRAM components in common as described above and a number of pads can be reduced. The first embodiment utilizes this arrangement.

Figure 4:
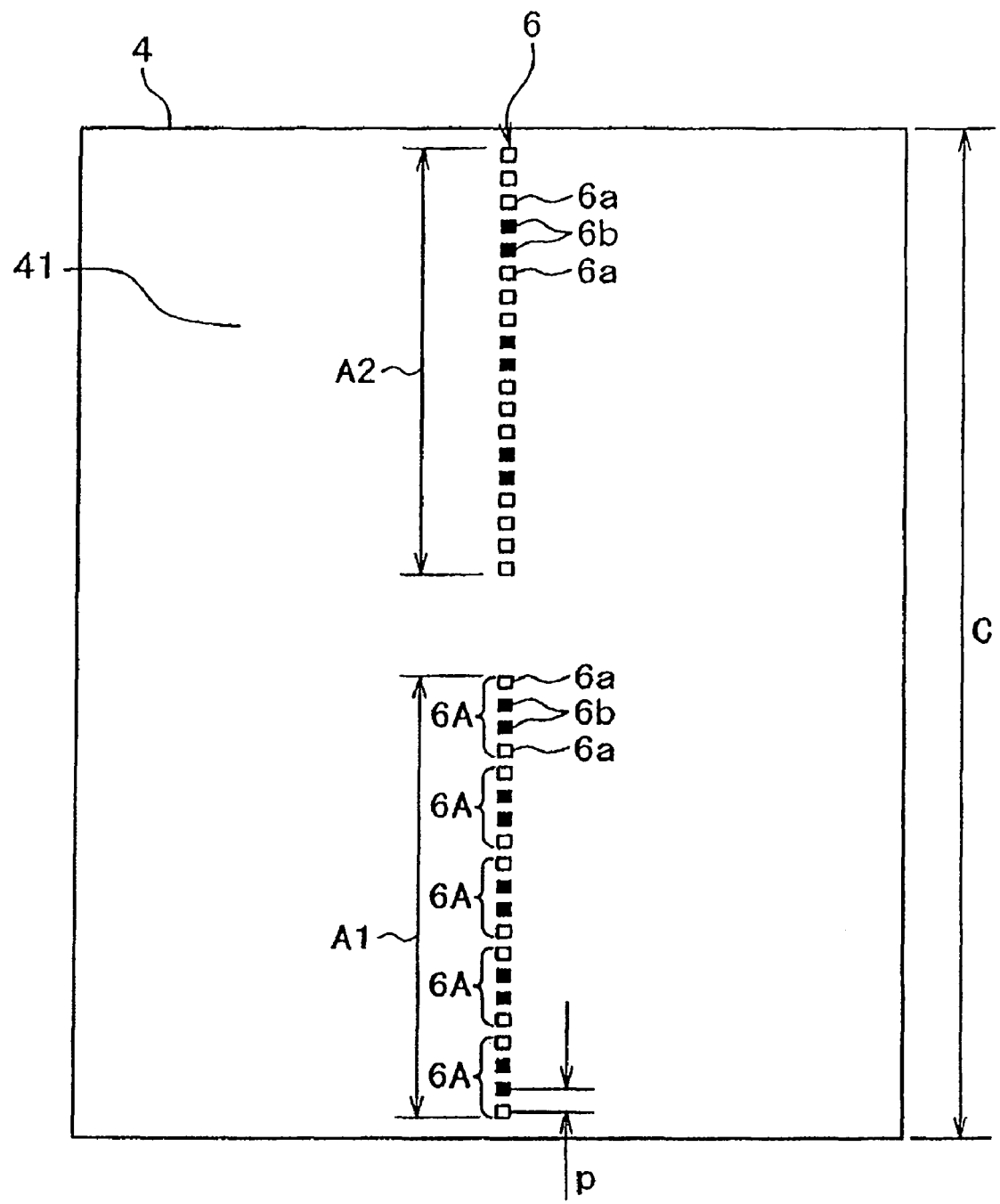
FIG. 4 is a plane view of the semiconductor chip for explaining an optimal number of pads in the semiconductor chip shown in FIG. 1.

In the first embodiment, as shown FIG. 4, respective pads 6 are arranged in a line so that the centers thereof are coincident in a vertical direction, however, the centers may be deviated by some hundreds μm in the horizontal direction in FIG. 4 for reasons of arrangement of memory components and respective components such as a transistor arranged on main surface 41 of semiconductor chip 4 and wires in the chip. Also, in the first embodiment, pads 6 are arranged at regular intervals, however, partial pad pitches may become large for the same reasons. Further, at the edges of main surface 41, in order to ensure reliability in packaging and to protect wear of pads 6 caused by breakage of chip 4, the pads are preferably arranged apart from the edges by approximate 80 to 100 μm. In DRAM, a principal control circuit for controlling semiconductor device 1 is often arranged in the vicinity of the center of chip 4. Accordingly, there are many cases in that pads 6 cannot be arranged in the vicinity of the center of chip 4, and, as shown in FIG. 4, pads 6 are often arranged in two divided areas. The control circuit of semiconductor device 1 may be allocated not in the vicinity of the center of chip 4. In this case, each of two divided areas where pads can be arranged may be further divided into two areas, and pads may be arranged on four divided areas in total.

FIG. 4 shows a length C of a longitudinal side of semiconductor chip 4 along the arrangement direction of pads 6, a length A (=A1+A2) of areas where pads 6 can be arranged, and a minimum pitch p for pad arrangement. A relationship of A<C is satisfied between the length A and the length C. Pads 6 arranged in the area A where pads can be arranged include signal pads 6a, and power supply pads 6b or ground pads 6b. Input/output buffers are arranged in an area of length A1, and input/output buffers and other components are arranged by mixture in an area of length A2. In a typical DRAM, a power supply or a ground of this input/output buffer is separated from a power supply or a ground except the input/output buffer inside a chip. Also, input/output buffers are collectively arranged in an area on main surface 41 of chip 4. Therefore, it is usual that signal pads connected to input/output buffers and power supply pad connected to the power supply and ground pad connected to the ground in input/output buffer are arranged so as not to be dispersed but so as to be in areas divided to some extent.

In the first embodiment, when a total number of power supply pads 6bV and ground pads 6bG (a total number of electrode pads 6b) is represented by N1, the total number N1 of electrode pads 6b is set so as to satisfy a relationship of N1/(A/p)>0.4 between a total number (A/p) of pads which can be arranged in area A (=A1+A2) where pads can be arranged and N1. In terms of this, the power supply based inductance can be made low, and a reduction in size of semiconductor chip 4 can be attained.

Also, in the first embodiment, when a total number of electrode pads 6b in an area A1 where pads can be arranged is represented by N2, the total number of power supply pads 6bV and ground pads 6bG is set so as to satisfy a relationship of N2/(A1/p)>0.12 between a total number (A1/p) of pads which can be arranged in area A1 where pads can be arranged and the total number N2 of electrode pads 6b. In terms of this, the power supply based inductance can be made low, and a reduction in size of semiconductor chip 4 can be attained.

It is significant to set the total numbers N1, N2 of pads when a semiconductor chip is small. As its reason, when a semiconductor chip is sufficiently large, a number of pads 6 to be arranged can be increased, and, in addition to signal pads 6a defined by specifications of semiconductor device 1, the total numbers N1, N2 of electrode pads 6b for improving electrical characteristics can be increased relatively easily.

When semiconductor chip 4 is small, the number of signal pads 6a, which cannot be reduced, is maintained, and the total numbers N1, N2 of electrode pads 6b are reduced. In the first embodiment, by setting a ratio of the total number N1 of electrode pads 6b to the total number (A/p) of all pads which can be arranged in an area of length A when pads 6 are arranged at minimum pitch p more than 0.4 or by setting a ratio of the total number N2 of electrode pads 6b to the total number (A1/p) of all pads which can be arranged in an area of length A when pads 6 are arranged at minimum pitch p more than 0.12, even if semiconductor device 1 operates synchronously with a high clock frequency such as some hundred MHz, power supply inductance and ground inductance can be maintained at low levels. Accordingly, high-speed operation can be performed without malfunction caused by noise.

Incidentally, FIG. 4 shows the DRAM where pads are decreased from the actual number of pads.

Next, explanations will be given of the second embodiment with reference to FIG. 5 and FIG. 6. The second embodiment differs from the first embodiment in the following respects, and the others are basically similar to those of the first embodiment.

Figure 5:
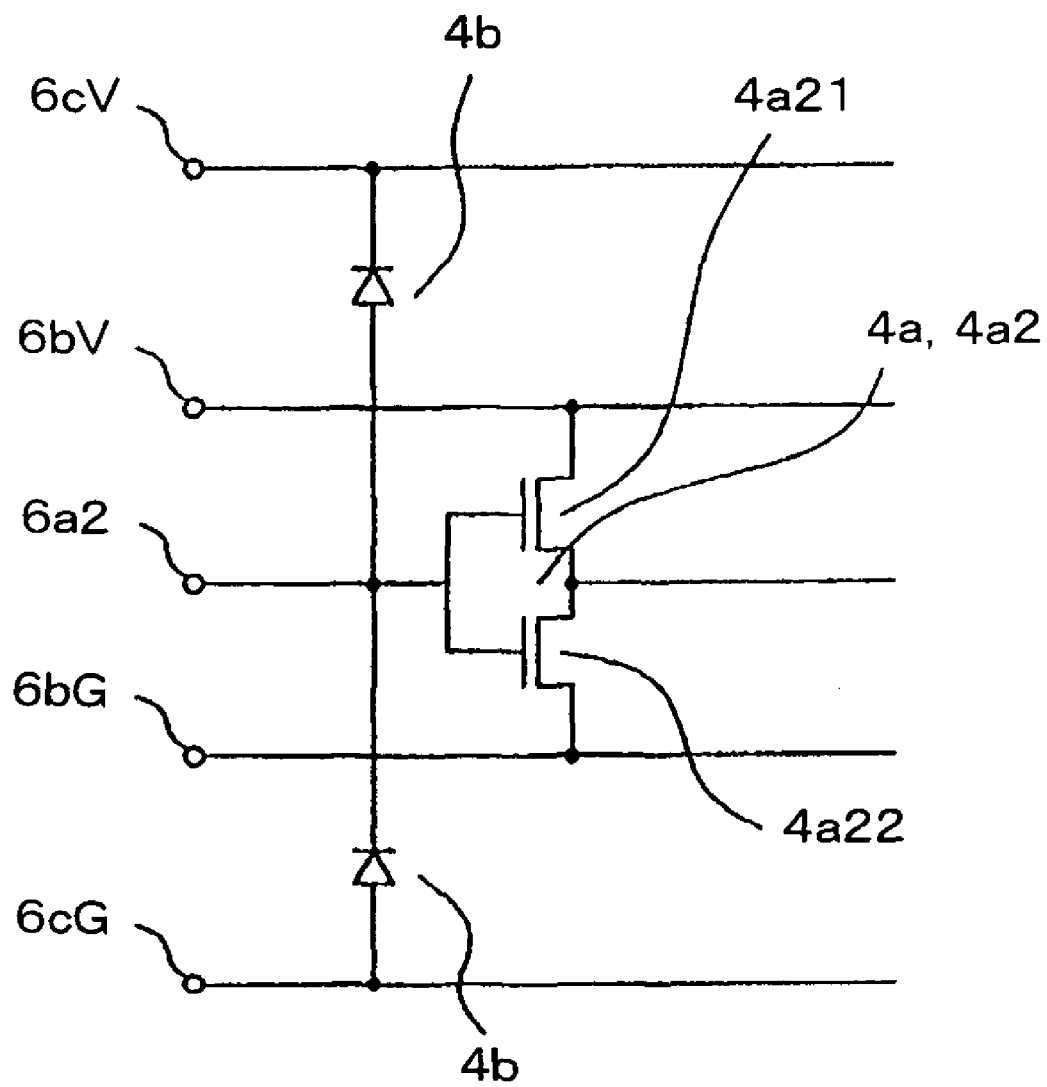
FIG. 5 is a circuit diagram of an input buffer arranged in a semiconductor chip of a semiconductor device of a second embodiment according to the present invention.
Figure 6:
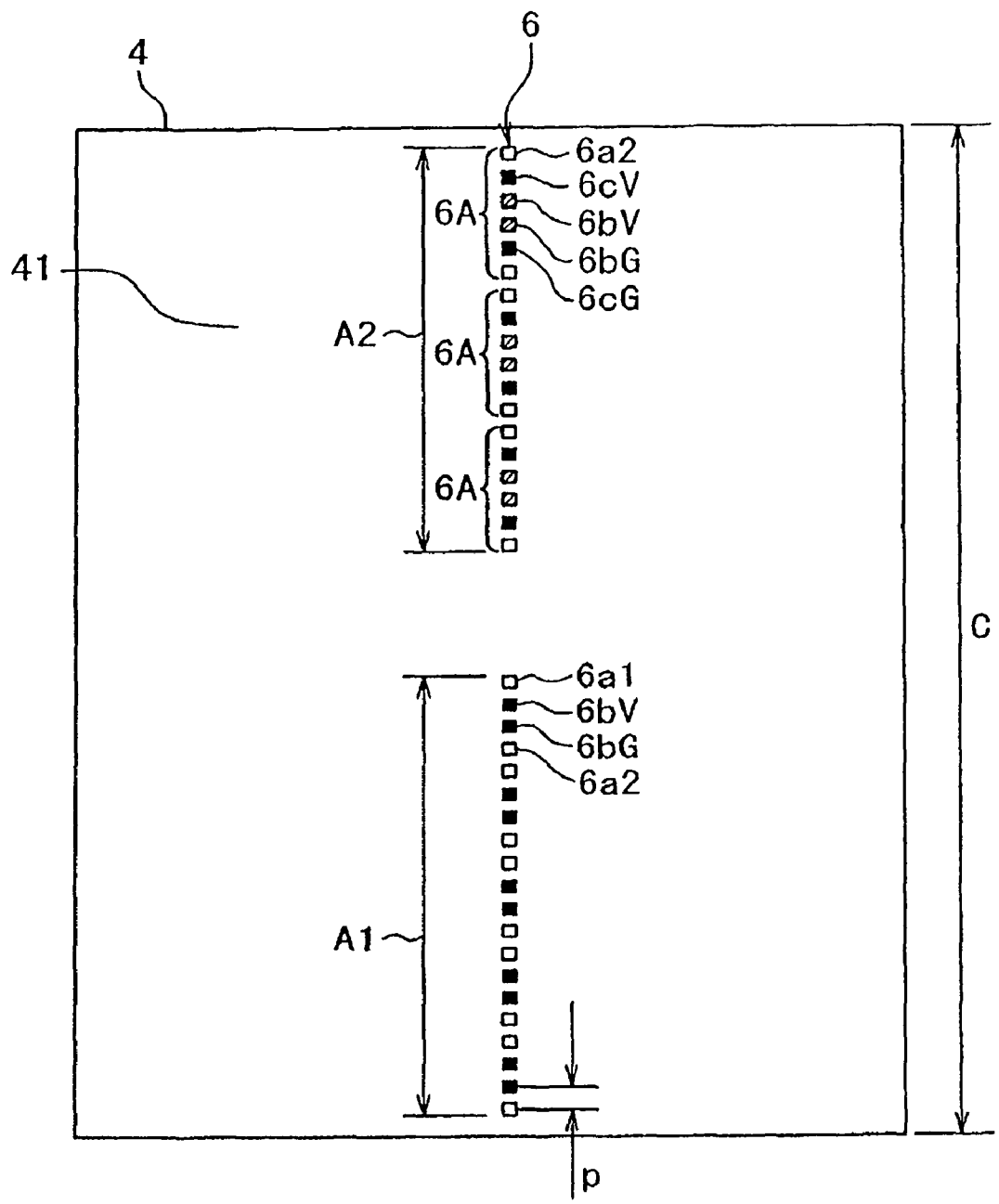
FIG. 6 is a plane view of the semiconductor chip for explaining an optimal number of pads in the semiconductor chip of the second embodiment according to the present invention.

Input buffer 4a2 shown in FIG. 5 is different from input/output buffer 4a1 described in the first embodiment in the following respects. Signal pad 6a2 connected to input buffer 4a2 is connected to excusive power supply pad 6cV and excusive ground pad 6cG via at least two protection diodes 4b inside semiconductor chip 4. In addition to those, similarly to input/output buffer 4a1 described in the first embodiment, there are power supply pad 6bV connected to one transistor 4a21 in the buffer and ground pad 6bG connected to another transistor 4a22 in the buffer.

In a case of input buffer 4a2 like this, power supply pads and ground pads are mainly power supply pad 6cV and ground pad 6cG connected with protection diodes 4b. The reason is as follows. Capacitance in a path from signal pad 6a2 to exclusive power supply pad 6cV and exclusive ground pad 6cG via respective protection diodes 4b is incomparably larger than capacitance in a path from signal pad 6a2 to power supply pad 6bV and ground pad 6bG via two MOS transistors 4a21, 4a22 in input buffer 4a2. Accordingly, in a high frequency band where this semiconductor device operates, series-impedance is low and a feedback current corresponding to a signal current flowing through the input pad tends to flow in an inverse direction via power supply pad 6cV and ground pad 6cG. As a result, power supply pad 6cV and ground pad 6cG connected with protection diodes 4b are main power supply pad and ground pad.

On this account, in input buffer 4a2, in order to improve characteristics for higher-speed operation, it is necessary that various pads are appropriately arranged while grasping power supply pad 6cV and ground pad 6cG connected with protection diodes 4b rather than power supply pad 6bV connected to the power supply and ground pad 6bG connected to the ground in input buffer 4a2.

In the second embodiment, signal pads 6a2 are arranged at the outmost side in pad group 6A, power supply pad 6cV and ground pad 6cG connected with protection diodes 4b are arranged adjacently thereto at the inside, and power supply pad 6bV connected to the power supply and ground pad 6bG connected to the ground in input buffer 4a2 are arranged at the inside thereof.

When a total number of power supply pad 6cV and ground pad 6cG connected with protection diodes 4b and power supply pad 6bV connected to the power supply and ground pad 6bG connected to the ground in input buffer 4a2 is represented by N3, there is a relationship of N3/(A/p)>0.3 between a total number (A/p) of pads which can be arranged in area A2 where pads can be arranged and the total N3. In this way, by ensuring power supply pad and ground pad which are important in high-speed operation, a reduction in noise, namely, high-speed operation can be attained. Further, there is no possibility that power supply pads and ground pads are increased inadvertently, and therefore this arrangement is effective in a reduction in size of semiconductor chip 4.

In the second embodiment, when a total number of electrode pads 6b in area A2 where pads can be arranged is represented by N4, a total number of power supply pads 6bV and ground pads 6bG is set so as to satisfy a relationship of N4/(A2/p)>0.18 between a total number (A2/p) of pads in an area A2 where pads can be arranged and the total number N4. In terms of this, power supply inductance can be made low, and a reduction in size of semiconductor chip 4 can be attained.

Figure 7:
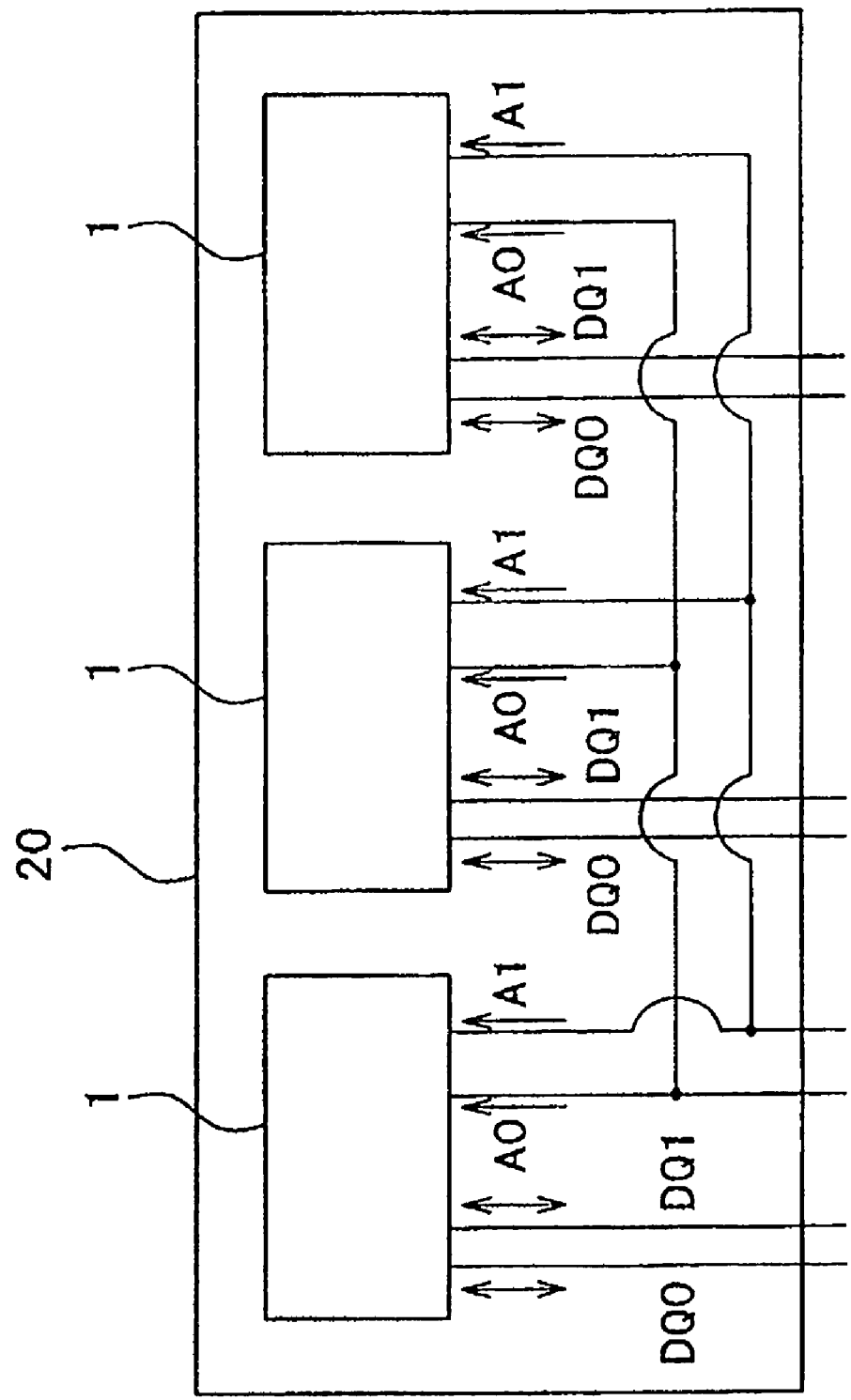
FIG. 7 is a view showing that a plurality of semiconductor devices of the second embodiment according to the present invention is mounted on a memory module substrate.

Now, explanations will be given that the power supply and the ground in input/output buffer 4a1 are electrically tighter than those in the input buffer, namely, that noise tends to occur with reference to FIG. 7. FIG. 7 is a view showing that semiconductor devices 1 according to the second embodiment are mounted on memory module substrate 20. In FIG. 7, pins denoted by DQx (x is a numeral) are input/output pins connected to input/output buffer 4a1. On the other hand, pins denoted by Ax (x is a numeral) are input-only pins such as an address pin and a control pin and are connected to input buffer 4a2. Also, arrows in FIG. 7 show signal transmission directions. In input/output pins DQ0, DQ1, signals are transmitted bi-directionally, while, in input-only pins A0, A1, signals are transmitted only from the outside to semiconductor device 1.

As shown in FIG. 7, input/output pins DQ0, DQ1 are different from input-only pins A0, A1 as to wiring topology in the outside of the semiconductor device. As to input/output pins DQ0, DQ1, each pin, namely, pad is directly connected one-to one with the other LSI or semiconductor device in the outside of semiconductor device 1. On the other hand, as to input-only pins A0, A such as address pins, pins of the same kind in each semiconductor device 1 (DRAM) are connected in parallel, and then are connected with another LSI or semiconductor device in the outside. This indicates the reason why electrical attentions to input/output pins DQ0, DQ1 are more important. In other words, input-only pins A0, A1 such as address pins receive signals after being branched to a plurality of DRAMs, noise occurring in the power supply and the ground is small in comparison with no-branch. Input/output pins DQ0, DQ1 are one-to-one connected to an external device without branch at some midpoint, and therefore noise tends to occur and it is necessary to increase a number of corresponding power supply and ground pads.

Next, explanations will be given of the third embodiment with reference to FIG. 8. The third embodiment differs from the first embodiment in the following respects, and the others are basically similar to those of the first embodiment.

As described above, usually, in a semiconductor device such as a DRAM, for design and production reasons, when pads are arranged on semiconductor chip 4, for example, signal pad (data pad) 6a1 connected to input/output buffer 4a1 and signal pad (input-only pad) 6a2 connected to input-only buffer 4a2 are arranged in areas determined to some extent. Particularly, as described above, pads connected to input-only pins remarkably tend to be arranged in determined areas in comparison with input/output pads connected to input/output pins, and there may be a case in that no power supply pad and no ground pad are arranged inside the area where input pads are arranged. FIG. 8 shows arrangement areas 60a for power supply pads and ground pads and arrangement area 60b for data pads connected to input/output buffer. In FIG. 8, small black dots indicate that pads are omitted. Also, in data pad arrangement area 6b, data pins are electrically tight, and therefore, data pads, power supply pads, and ground pads are preferably combined to be arranged not only data pads.

Here, attentions are paid to input pad arrangement area 60c. In order to reduce the size of chip, power supply pads and ground pads cannot be arranged in this area. As to each pin, noise is low as described above. However, the number of input pads is large, and therefore, when considerations are given to a case where input pads operate at the same time, these are regarded as power supply/ground series having much electrical noise.

Figure 8:
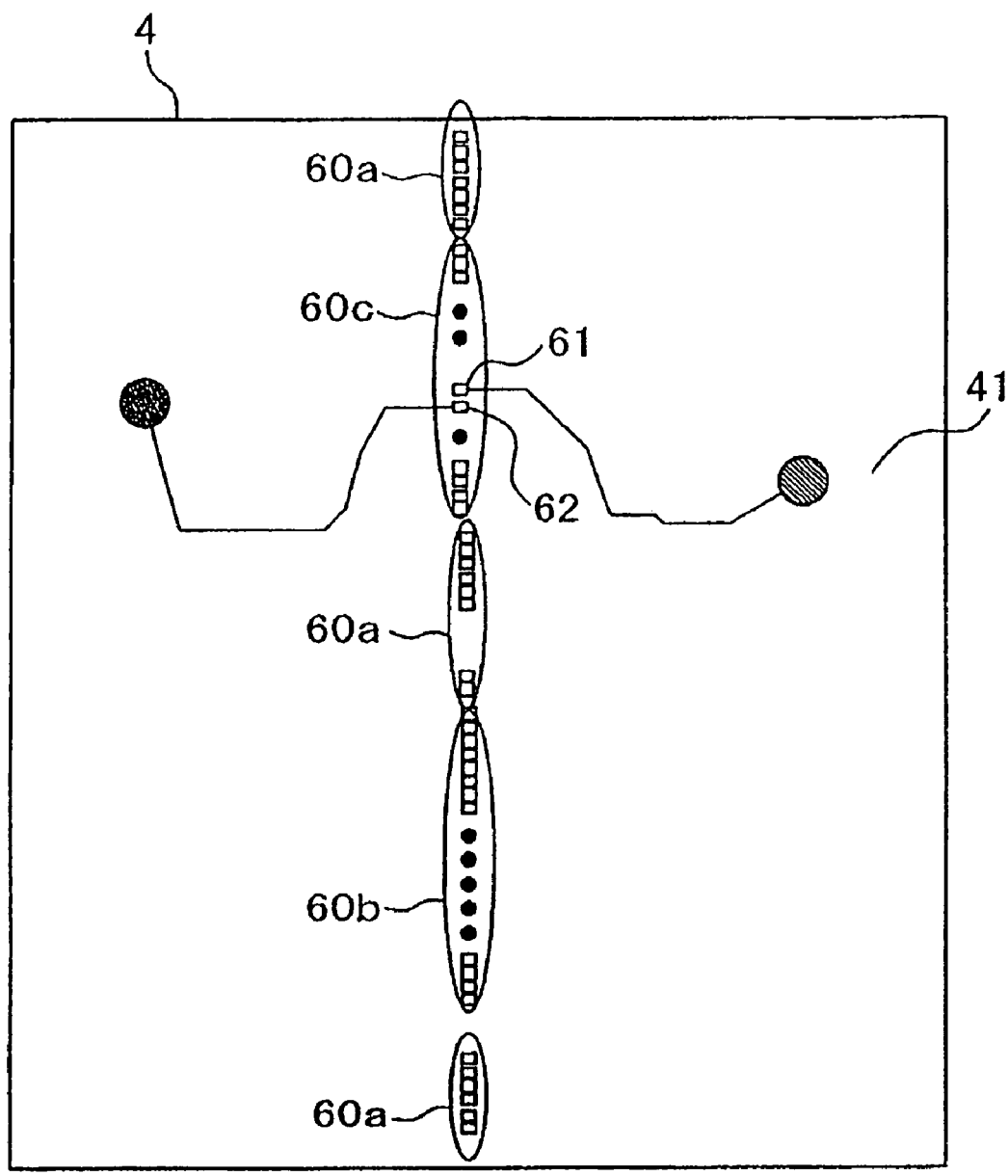
FIG. 8 is a plane view of a semiconductor chip for explaining an arrangement of pads in the semiconductor chip of a third embodiment according to the present invention.

In the third embodiment, in order to compensate for weak points in power supply/ground series in input pad arrangement area 60c, a pair of power supply pad 61 and ground pad 62 is arranged at an approximate center of a line of pads in input pad arrangement area 60c as shown in FIG. 8. With this arrangement, electrical characteristics can be dramatically improved. In this case, when power supply pad 61 and ground pad 62 are respectively connected to the power supply and the ground connected to protection diodes associated with input pads, the best result can be obtained.

In FIG. 8, a wire is drawn from added power supply pad 61 to a solder ball for the power supply, and a wire is drawn from added ground pad 62 to a solder ball for the ground. As shown in FIG. 8, since a pair of wires for the power supply and the ground are drawn in mutually opposite directions while the center line of pads is regarded as an axis, outstanding effects on a reduction in noise can be obtained.

In the third embodiment, in input pad arrangement area 60c, there are provided with at least one or more electrode pad for supplying the power supply voltage and at least one or more electrode pad for supplying the ground voltage.

Also, out of input pad arrangement area 60c, there are provided with at least one or more electrode pad for supplying the power supply voltage and at least one or more electrode pad for supplying the ground voltage.

Further, wires to be connection means are formed between external connection contacts of the semiconductor device. An electrode pad for supplying any power supply voltage in input pad arrangement area and an electrode pad for supplying any ground voltage out of input pad arrangement area are selected, or an electrode pad for supplying any ground voltage in input pad arrangement area and an electrode pad for supplying any power supply voltage out of input pad arrangement area are selected, and, when a semiconductor chip is divided into two by a straight line obtained by linking centers of two selected electrode pads, electrode pads can be selected in a manner that connection means connected to arbitrary-selected electrode pads and external connection contacts connected to the connection means are within one area of two divided areas of the semiconductor device.

An electrode pad for supplying the power supply voltage is preferably an electrode pad connected to the power supply of one protection diode connected to at least one input buffer in DRAM components in the semiconductor chip, and an electrode pad for supplying the ground voltage is preferably an electrode pad connected to the ground of anther protection diode different from the above-mentioned protection diode.

The present invention is available to a FBGA type DRAM provided with a wiring board having a core formed from epoxy resin impregnated with glass and a semiconductor chip mounted on a surface of the wiring board, wherein pads formed on a main surface of the semiconductor chip and pads on the wiring board are connected by wires.

Preferred embodiments are explained in details, however, it is thus apparent that the present invention is not limited to the above embodiments but may be changed and modified without departing from the scope of the invention.

What is claimed is:

1. A semiconductor device comprising:
   a semiconductor chip in which a plurality of semiconductor components are formed and a plurality of pads are arranged in a single line on a center part of a main surface of the semiconductor chip;
   a plurality of external connection contacts arranged in grids; and
   a plurality of wires for electrically connecting each of the pads and each of the external connection contacts;
   wherein the pads include a plurality of pad groups, each pad group including at least one power supply pad connected to the plurality of semiconductor components, at least one ground pad connected to the plurality of semiconductor components, and a plurality of signal pads respectively connected to the semiconductor components connected to the power supply pad and ground pad and for transmitting and receiving signals to/from the semiconductor components;
   wherein the power supply pad and the ground pad are commonly connected to at least two of the plurality of semiconductor components,
   wherein the power supply pad supplies a power supply voltage to the semiconductor components and the ground pad supplies a ground voltage to the semiconductor components;
   wherein in each of the pad groups, each of the signal pads is arranged immediately next to the power supply pad or the ground pad;
   wherein each of the wires extending from each of the signal pads is extended parallel to and in the same direction as a wire extending from the power supply pad or the ground pad which is immediately next to the signal pad in a same pad group;
   wherein the plurality of pad groups includes a first pad group wherein the wires extending from the signal pads of the first pad group extend in a first direction; and
   wherein the plurality of pad groups includes a second pad group immediately next to the first pad group, wherein the wires extending from the signal pads of the second pad group extend in a second direction opposite to the first direction.

2. The semiconductor device according to claim 1, wherein the external connection contacts are made of solder balls and are arranged at both sides of the line of the pads.

3. The semiconductor device according to claim 2, wherein each of the pad groups includes a power supply pad commonly connected to two semiconductor components, a ground pad commonly connected to the two semiconductor components, and two signal pads for transmitting and receiving signals to/from the two semiconductor components;
   the solder balls are arranged in three lines in grids at each of both sides of the line of pads; and
   the three lines of solder balls are arranged so as to alternately arrange a row in which a solder ball for transmitting and receiving a signal is positioned at a center and solder balls connected to an external power supply are positioned at both sides of the center and a row in which a solder ball connected to an external power supply is positioned at a center and solder balls for transmitting and receiving signals are positioned at both sides of the center.

4. A device comprising:
   a package substrate including an opening to define first and second area portions on opposing sides of the opening, the package substrate further including a group of first connecting terminals provided on the first area portion and a group of second connecting terminals provided on the second area portion;
   a semiconductor chip including a plurality of pads arranged in a single line, the semiconductor chip being mounted on the package substrate such that the pads are exposed by the opening of the package substrate, the pads comprising a first set of pads and a second set of pads adjacent to the first set of pads without an intervention of any one of remaining ones of the pads, each of the first and second sets of pads including a power supply pad, a ground pad, and two signal pads wherein all pads in the first set of pads are immediately adjacent to each other and all pads in the second set of pads are immediately adjacent to each other;

a first set of conductive lines electrically connecting the first set of pads to corresponding ones of the first connecting terminals; and a second set of conductive lines electrically connecting the second set of pads to corresponding ones of the second connecting terminals, wherein the first and second area portions are arranged such that the first set of conductive lines extend in a first direction, and the second set of conductive lines extend in a second direction opposite to the first direction, wherein all conductive lines extending from all pads of the first set of pads extend in the first direction, and wherein all conductive lines extending from all pads of the second set of pads extend in the second direction.

5. The device as claimed in claim 4, wherein the pads further comprise a third set of pads and a fourth set of pads sandwiched between the second set of pads and the third set of the pads, each of the third and fourth sets of pads including a power supply pad, a ground pad, and two signal pads, and further comprising a third set of conductive lines electrically connecting the third set of pads to corresponding ones of the second connecting terminals and a fourth set of conductive lines electrically connecting the fourth set of pads to corresponding ones of the first connecting terminals.

6. The device as claimed in claim 4, wherein the power supply pad and the ground pad are sandwiched between the two signal pads.

7. The device as claimed in claim 4, wherein the semiconductor chip includes a plurality of input/output circuits, the two signal pads of each of the first and second sets of pads are electrically connected correspondingly to ones of the input/output circuits, and each of the power supply pad and the ground pad of each of the first and second sets of pads is electrically connected in common to the ones of the input/output circuits.

8. The device as claimed in claim 4, wherein the pads further comprise a plurality of additional power supply pads and a plurality of additional ground pads, and a number obtained by dividing a sum of the number of the power supply pads of the first and second sets of pads, the ground pads of the first and second sets of pads, the plurality of additional power supply pads, and the plurality of additional ground pads in an area including all the pads on the semiconductor chip, by the total number of the pads in the area including all the pads on the semiconductor chip is more than 0.4.

9. The semiconductor device according to claim 1, wherein all wires extending from all pads of the first pad group extend in the first direction, and wherein all wires extending from all pads of the second pad group extend in the second direction.

10. The semiconductor device according to claim 1, wherein all pads of the first pad group are serially arranged in the single line without an intervention of any pads that are not of the first pad group, and wherein all pads of the second pad group are serially arranged in the single line without an intervention of any pads that are not of the second pad group.

11. The device as claimed in claim 4, wherein all pads of the first set of pads are serially arranged in the single line without an intervention of any pads that are not of the first set of pads, and wherein all pads of the second set of pads are serially arranged in the single line without an intervention of any pads that are not of the second set of pads.

* * * * *